(12) United States Patent
Tzeng et al.

(10) Patent No.: US 9,442,510 B2
(45) Date of Patent: Sep. 13, 2016

(54) CLOCK CIRCUIT AND METHOD OF OPERATING THE SAME

(71) Applicant: TAIWAN SEMICONDUCTOR MANUFACTURING COMPANY, LTD., Hsinchu (TW)

(72) Inventors: Jiann-Tyng Tzeng, Hsinchu (TW); Meng-Hung Shen, Zhubei (TW); Yi-Feng Chen, Xinpu Township (TW); Charles Chew-Yuen Young, Cupertino, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 49 days.

(21) Appl. No.: 14/613,817

(22) Filed: Feb. 4, 2015

(65) Prior Publication Data

US 2016/0147252 A1    May 26, 2016

Related U.S. Application Data

(60) Provisional application No. 62/084,776, filed on Nov. 26, 2014.

(51) Int. Cl.
*G06F 1/04* (2006.01)
*G06F 1/12* (2006.01)
*H03K 19/20* (2006.01)

(52) U.S. Cl.
CPC ............. *G06F 1/12* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 8,058,902 | B1* | 11/2011 | Khurana | G06F 1/12 326/46 |
| 2004/0159896 | A1* | 8/2004 | Honda | H03K 5/1506 257/391 |
| 2005/0057285 | A1* | 3/2005 | Austin | H03K 5/04 327/115 |
| 2006/0119716 | A1* | 6/2006 | Noguchi | H04N 5/3577 348/297 |
| 2006/0284658 | A1* | 12/2006 | Wright | H03K 17/163 327/170 |

* cited by examiner

*Primary Examiner* — Cassandra Cox
(74) *Attorney, Agent, or Firm* — Hauptman Ham, LLP

(57) ABSTRACT

A clock gating circuit includes a first transistor, a first inverter and a second transistor. A first terminal of the first transistor receives a clock input signal. A second terminal of the first transistor is coupled to a first node. The first transistor adjusts a voltage of the first node to a first voltage based on the clock input signal. The first inverter is coupled to the first node and receives the voltage of the first node, and outputs a clock output signal. A first terminal of the second transistor receives the clock input signal. A second terminal of the second transistor is coupled to the first node and a second node. The second transistor adjusts the voltage of the first node or the second node to the second voltage, based on the clock input signal.

20 Claims, 3 Drawing Sheets

CLOCK CIRCUIT AND METHOD OF OPERATING THE SAME

BACKGROUND

The semiconductor integrated circuit (IC) industry has produced a wide variety of digital devices to address issues in a number of different areas. In some of these digital devices, a clock tree is used for distributing a common clock signal to various components in order to synchronize the operation of the various components. Differences in the arrival time of the clock signals at two or more of the various components components of the IC results in errors affecting IC performance, in some instances.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
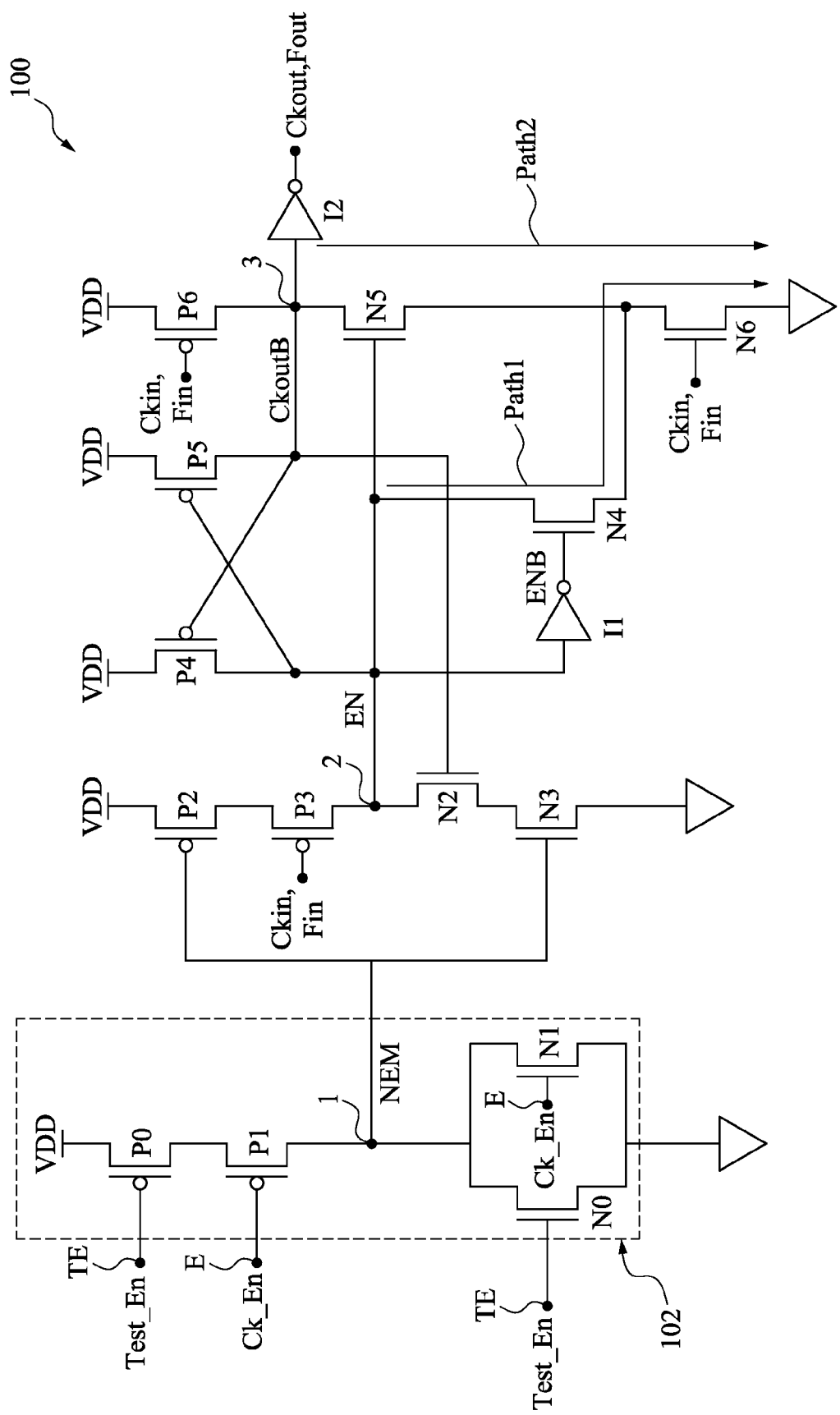
FIG. 1 is a schematic diagram of a clock circuit in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A clock circuit includes a NOR gate 102 (FIG. 1) coupled to a first node, a first P-type transistor, a second P-type transistor, a first discharge path, a second discharge path and a second inverter. The clock circuit is configured to receive an enable signal and a clock input signal. The clock circuit is configured to output a clock output signal. In some embodiments, if the clock circuit is enabled or activated, the clock circuit is configured to allow the input clock signal to pass to the output such that the input clock signal is substantially equal to the output clock signal for a time window. In some embodiments, if the clock circuit is disabled or deactivated, the clock circuit is configured to prevent the input clock signal from propagating to the output such that the input clock signal is not equal to the output clock signal for another time window. In some embodiments, other circuitry is connected to the clock circuit and the clock output signal is utilized by the other circuitry as a clock signal. In some embodiments, the clock circuit is a clock gating cell.

FIG. 1 is a schematic diagram of a clock circuit 100 in accordance with one or more embodiments.

Clock circuit 100 includes n-type transistors N0, N1, N2, N3, N4, N5 and N6, p-type transistors P0, P1, P2, P3, P4, P5 and P6 and inverters I1 and I2. In some embodiments, at least one of the n-type transistors includes an n-type metal-oxide-semiconductor (NMOS) transistor, an n-type fin field effect transistor (FinFET) or another suitable n-type transistor. In some embodiments, at least one of the p-type transistors includes a p-type metal-oxide-semiconductor (PMOS) transistor, a p-type FinFET or another suitable p-type transistor.

Clock circuit 100 is configured to receive an input clock signal Ckin. Clock circuit 100 is configured to output an output clock signal Ckout. In some embodiments, input clock signal Ckin is an oscillating signal having an oscillation frequency Fin. In some embodiments, input clock signal Ckin is a single phase clock. In some embodiments, output clock signal Ckout is an oscillating signal having an oscillation frequency Fout. In some embodiments, output clock signal Ckout is a logically low signal. In some embodiments, output clock signal Ckout is a logically high signal. In some embodiments, the output clock signal Ckout is substantially equal to the input clock signal Ckin, if the clock circuit 100 is enabled or activated. In some embodiments, an amplitude of the output clock signal Ckout is substantially equal to an amplitude of the input clock signal Ckin. In some embodiments, substantially equal includes values within a range of a reference value, e.g., ±5% of the reference value.

Clock circuit 100 includes a NOR gate 102. NOR gate 102 includes p-type transistors P0 and P1 as well as n-type transistors N0 and N1. A source terminal of p-type transistor P0 is electrically connected to a power supply voltage (VDD). A drain terminal of p-type transistor P0 is electrically connected to a source terminal of p-type transistor P1. A gate terminal of p-type transistor P0 is configured to receive a first enable signal Test_En. The gate terminal of p-type transistor P0 is configured to receive the first enable signal Test_En at a node TE. First enable signal Test_En is a logically low signal or a logically high signal. In some embodiments, first enable signal Test_En is an external enable signal generated by an external circuit. In some embodiments, during scan testing, clock circuit 100 is configured to be enabled or activated using first enable signal Test_En.

A source terminal of p-type transistor P1 is electrically connected to a drain terminal of p-type transistor P0. A drain terminal of p-type transistor P1 is electrically connected to drain terminals of n-type transistors N0 and N1, as well as to a gate terminal of n-type transistor N3 and a gate terminal of p-type transistor P2 at a node 1. A gate terminal of p-type transistor P1 is configured to receive a second enable signal Ck_En. The gate terminal of p-type transistor P1 is configured to receive the second enable signal Ck_En at a node E. Second enable signal Ck_En is a logically low signal or a logically high signal. In some embodiments, second enable signal Ck_En is an external enable signal generated by an external circuit. In some embodiments, second enable signal Ck_En is generated by a same external circuit as first enable signal Test_En. In some embodiments, second enable signal Ck_En is generated by a different external circuit from first enable signal Test_En. In some embodiments, clock circuit 100 is configured to be enabled or activated by second enable signal Ck_En. In some embodiments, second enable signal Ck_En has a same function as first enable signal Test_En, e.g. allowing the input clock signal Ckin to pass to the output of clock circuit 100 as output clock signal Ckout.

P-type transistors P0 and P1 are configured to selectively connect VDD to node 1. In some embodiments, p-type transistors P0 and P1 are configured to generate a first control signal NEN. In some embodiments, first control signal NEN is a logically low signal or a logically high signal.

Source terminals of n-type transistors N0 and N1 are electrically connected to a ground voltage (VSS). A gate terminal of n-type transistor N0 is configured to receive first enable signal Test_En. The gate terminal of n-type transistor N0 is configured to receive first enable signal Test_En at node TE. A gate terminal of n-type transistor N1 is configured to receive second enable signal Ck_En. The gate terminal of n-type transistor N1 is configured to receive second enable signal Ck_En at node E.

N-type transistors N0 and N1 are configured to selectively connect VSS to node 1. In some embodiments, n-type transistors N0 and N1 are configured to generate first control signal NEN. N-type transistors N0 and N1 and p-type transistors P0 and P1 are arranged as an exemplary NOR gate 102. In some embodiments, a different NOR gate 102 is substituted for n-type transistors N0 and N1 and p-type transistors P0 and P1, where NOR gate 102 is configured to receive second enable signal Ck_En E and first enable signal Test_En, and is configured to output first control signal NEN. In some embodiments, first control signal NEN is generated based on performing a NOR operation on the first enable signal Test_En and the second enable signal Ck_En. In some embodiments, first control signal NEN is inverted from either first enable signal Test_En or second enable signal Ck_En.

A source terminal of p-type transistor P2 is electrically connected to VDD. A drain terminal of p-type transistor P2 is electrically connected to a source terminal of p-type transistor P3. A gate terminal of p-type transistor P2 is electrically connected to the drain terminals of n-type transistors N0 and N1, the drain terminal of p-type transistor P1 and the gate terminal of n-type transistor N3 at node 1. The gate terminal of p-type transistor P2 is configured to receive first control signal NEN.

A source terminal of p-type transistor P3 is electrically connected to the drain terminal of p-type transistor P2. A drain terminal of p-type transistor P3 is electrically connected to a drain terminal of n-type transistor N2, a drain terminal of p-type transistor P4, a drain terminal of n-type transistor N4, a gate terminal of n-type transistor N5, a gate terminal of p-type transistor P5 and an input terminal of inverter I1 at node 2. A gate terminal of p-type transistor P3 is configured to receive input clock signal Ckin. Input clock signal Ckin selectively activates p-type transistor P3. In some embodiments, p-type transistors P2 and P3 are configured to generate a second control signal EN.

A source terminal of n-type transistor N2 is electrically connected to the drain terminal of n-type transistor N3. A drain terminal of n-type transistor N2 is electrically connected to a drain terminal of p-type transistor P3, a drain terminal of p-type transistor P4, a drain terminal of n-type transistor N4, a gate terminal of n-type transistor N5, a gate terminal of p-type transistor P5 and an input terminal of inverter I1 at node 2. A gate terminal of n-type transistor N2 is electrically connected to a gate terminal of p-type transistor P4, a drain terminal of p-type transistor P5, a drain terminal of p-type transistor P6, a drain terminal of n-type transistor N5 and an input terminal of inverter I2 at node 3.

A source terminal of n-type transistor N3 is electrically connected to VSS. A drain terminal of n-type transistor N3 is electrically connected to a source terminal of n-type transistor N2. A gate terminal of n-type transistor N3 is electrically connected to the drain terminals of m-type transistors N0 and N1, the drain terminal of p-type transistor P1 and the gate terminal of p-type transistor P2 at node 1. The gate terminal of n-type transistor N3 is configured to receive first control signal NEN. In some embodiments, n-type transistors N2 and N3 are configured to generate second control signal EN.

A source terminal of p-type transistor P4 is electrically connected VDD. A drain terminal of p-type transistor P4 is electrically connected to a drain terminal of p-type transistor P3, a drain terminal of n-type transistor N2, a drain terminal of n-type transistor N4, a gate terminal of n-type transistor N5, a gate terminal of p-type transistor P5 and an input terminal of inverter I1 at node 2. A gate terminal of p-type transistor P4 is electrically connected to a gate terminal of n-type transistor N2, a drain terminal of p-type transistor P5, a drain terminal of p-type transistor P6, a drain terminal of n-type transistor N5 and an input terminal of inverter I2 at node 3.

A source terminal of p-type transistor P5 is electrically connected to VDD. A drain terminal of p-type transistor P5 is electrically connected to a gate terminal of n-type transistor N2, a gate terminal of p-type transistor P4, a drain terminal of p-type transistor P6, a drain terminal of n-type transistor N5 and an input terminal of inverter I2 at node 3. A gate terminal of p-type transistor P5 is electrically connected to a drain terminal of p-type transistor P3, a drain terminal of n-type transistor N2, a drain terminal of n-type transistor N4, a gate terminal of n-type transistor N5, a drain terminal of p-type transistor P4 and an input terminal of inverter I1 at node 2.

A source terminal of p-type transistor P6 is electrically connected to VDD. A drain terminal of p-type transistor P6 is electrically connected to a gate terminal of n-type transistor N2, a gate terminal of p-type transistor P4, a drain terminal of p-type transistor P5, a drain terminal of n-type transistor N5 and an input terminal of inverter I2 at node 3. A gate terminal of p-type transistor P6 is configured to receive input clock signal Ckin. Input clock signal Ckin selectively activates p-type transistor P6. In some embodiments, input clock signal Ckin received by p-type transistor P6 is substantially equal to a first voltage level. In some embodiments, the first voltage level is substantially equal to one half of VDD (VDD/2).

An input terminal of inverter I1 is electrically connected to a drain terminal of n-type transistor N2, a drain terminal of p-type transistor P3, a drain terminal of p-type transistor P4, a drain terminal of n-type transistor N4, a gate terminal of n-type transistor N5 and a gate terminal of p-type transistor P5 at node 2. An output terminal of inverter I1 is electrically connected to the gate of n-type transistor N4. An input terminal of inverter I1 is configured to receive second control signal EN. An output terminal of inverter I1 is configured to output an inverted second control signal ENB to n-type transistor N4. Inverted second control signal ENB selectively activates n-type transistor N4.

A source terminal of n-type transistor N4 is electrically connected to the drain terminal of n-type transistor N6 and the source terminal of n-type transistor N5. A drain terminal of n-type transistor N4 is electrically connected to a drain terminal of p-type transistor P3, a drain terminal of p-type transistor P4, a drain terminal of n-type transistor N2, a gate terminal of n-type transistor N5, a gate terminal of p-type transistor P5 and an input terminal of inverter I1 at node 2. A gate terminal of n-type transistor N4 is electrically connected to an output terminal of inverter I1. A gate terminal of n-type transistor N4 is configured to receive inverted second control signal ENB.

A source terminal of n-type transistor N5 is electrically connected to the drain terminal of n-type transistor N6 and the source terminal of n-type transistor N4. A drain terminal of n-type transistor N5 is electrically connected to a drain terminal of p-type transistor P6, a gate terminal of n-type transistor N2, a gate terminal of p-type transistor P4, a drain terminal of p-type transistor P5 and an input terminal of inverter I2 at node 3. A gate terminal of n-type transistor N5 is electrically connected to a drain terminal of p-type transistor P3, a drain terminal of p-type transistor P4, a drain terminal of n-type transistor N2, a drain terminal of n-type transistor N4, a gate terminal of p-type transistor P5 and an input terminal of inverter I1 at node 2. A gate terminal of n-type transistor N5 is configured to receive second control signal EN. Second control signal EN selectively activates n-type transistor N5.

A source terminal of n-type transistor N6 is electrically connected to VSS. A drain terminal of n-type transistor N6 is electrically connected to the source terminal of n-type transistor N4 and the source terminal of n-type transistor N5. A gate terminal of n-type transistor N6 is electrically connected to a source of input clock signal Ckin. The gate terminal of n-type transistor N6 is configured to receive input clock signal Ckin. Input clock signal Ckin selectively activates n-type transistor N6.

An input terminal of inverter I2 is electrically connected to a drain terminal of p-type transistor P5, a gate terminal of n-type transistor N2, a gate terminal of p-type transistor P4, a drain terminal of p-type transistor P6 and a drain terminal of n-type transistor N5 at node 3. An output terminal of inverter I2 is electrically connected to circuitry (not shown) configured to receive the output clock signal Ckout. An input terminal of inverter I2 is configured to receive a third control signal CkoutB. Third control signal CkoutB is an inverted version of output clock signal Ckout.

By utilizing clock circuit 100, a number of transistors, i.e., n-type transistor N6 and p-type transistors P3 and P6, toggled by a clock signal, i.e., Ckin is three. The number of transistors toggled by the clock signal is reduced when compared with other clock gating cells. In some embodiments, by utilizing clock circuit 100, a total number of transistors is less than twenty two. In some embodiments, by utilizing clock circuit 100, the total number of transistors is eighteen. In some embodiments, by utilizing clock circuit 100, the total number of transistors is reduced when compared with other clock gating cells. In some embodiments, clock circuit 100 is a race free structure having full-swing capability. In some embodiments, the amount of power consumed by clock circuit 100 is reduced when compared with other clock gating cells.

Figure 2:
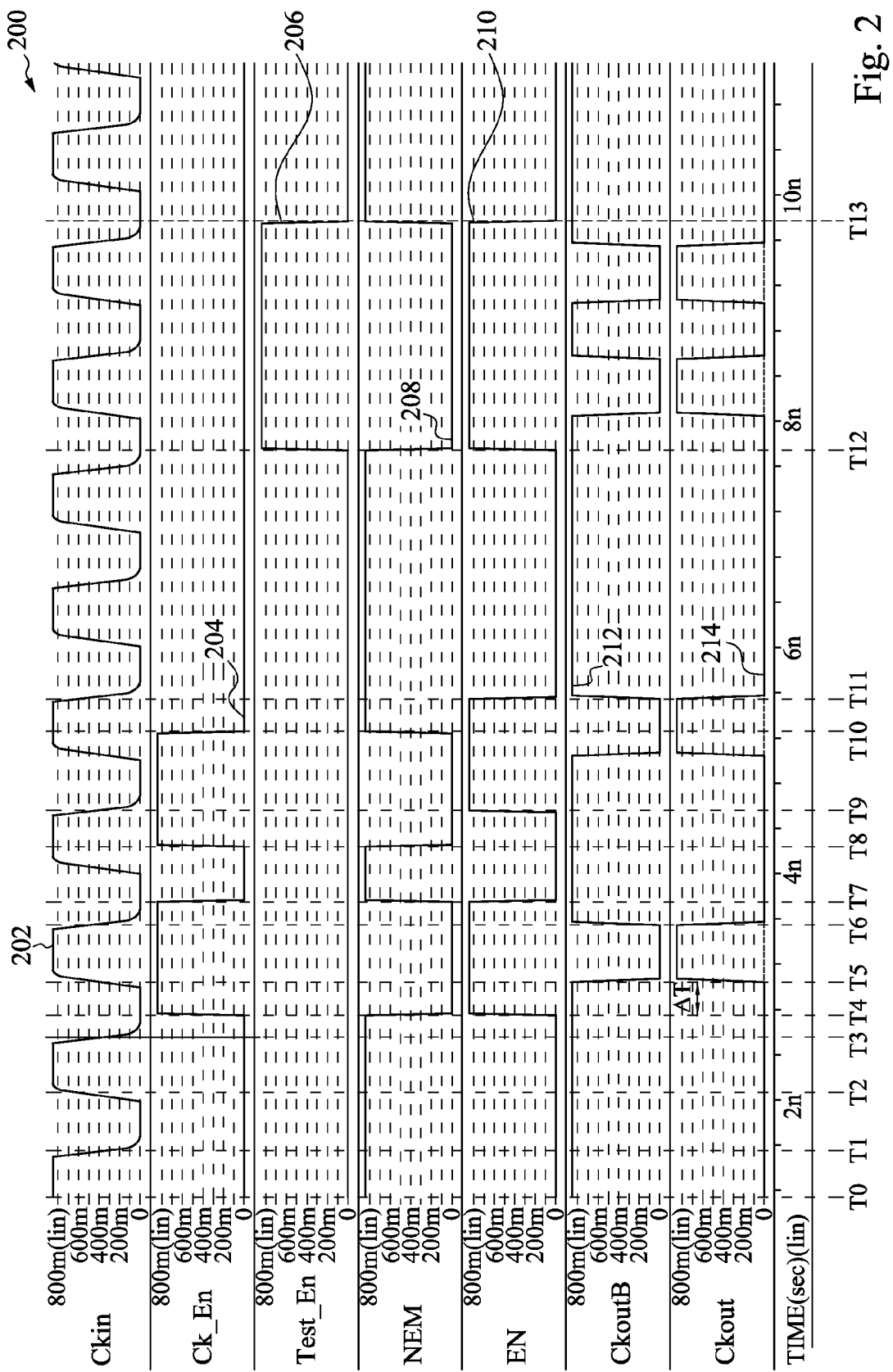
FIG. 2 is a waveform diagram of various signals during operation of a clock circuit in accordance with one or more embodiments.

FIG. 2 is a waveform diagram 200 of various signals during operation of a clock circuit in accordance with one or more embodiments. In some embodiments, the clock circuit used to generate waveform diagram 200 is clock circuit 100 (FIG. 1).

Curve 202 represents input clock signal Ckin; curve 204 represents the second enable signal Ck_En; curve 206 represents the first enable signal Test_En; curve 208 represents the first control signal NEN; curve 210 represents the second control signal EN; curve 212 represents the third control signal CkoutB; and curve 214 represents the output clock signal Ckout.

Curve 202 (e.g., input clock signal Ckin) oscillates from a logically high value to a logically low value at an oscillation frequency of Fin.

At time T0, curve 202 is logically high. At time T0, curve 210 is logically low. At time T0, curve 204 (or curve 206 is logically low. In some embodiments, if curve 204 is logically low and curve 206 is logically low, the clock circuit, e.g., clock circuit 100 (FIG. 1), is deactivated and the clock circuit is configured to output a signal (that is logically low. In some embodiments, if either curve 204 or curve 206 is logically high, the clock circuit is activated and the clock circuit is configured to output a signal that is logically high.

At time T1, curve 202 transitions from a logically high value to a logically low value. At time T1, curve 208 is logically high. In some embodiments where the clock circuit is clock circuit 100, if curve 202 transitions to a logically low value, p-type transistor P6 is activated and pulls node 3 to a logical high such that third control signal CkoutB is logically high signal. In this example, if third control signal CkoutB is logically high, inverter I2 is outputs a logically low value.

In this example, if node 3 is pulled to a logical high, n-type transistor N2 is activated. In some embodiments, if n-type transistors N2 and N3 are activated, n-type transistors N2 and N3 pull node 2 to a logical low such that second control signal EN is logically low.

At time T2, curve 202 transitions from a logically low value to a logically high value. At time T2, curve 208 is logically high. In some embodiments where the clock circuit is clock circuit 100, if curve 202 transitions to a logically high value, p-type transistors P3, P6 are deactivated and n-type transistor N6 is activated. In this example, initially after curve 202 transitions to a logically high value, second control signal EN is logically low, and inverter I1 is outputs an inverted second control signal ENB to n-type transistor N4. In this example, inverted second control signal ENB activates n-type transistor N4 and node 2 is pulled to a logical low by n-type transistors N4 and N6 by a first discharge path Path1 (FIG. 1). In this example, n-type transistors N4 and N6 are configured to provide a first discharge path Path1 to VSS. In this example, n-type transistors N4 and N6 are configured to keep second control signal EN at a logically low value using first discharge path Path1. In this example, if second control signal EN is logically low, p-type transistor P5 is activated and is pulls node 3 to a logical high such that third control signal CkoutB is logically high signal. In this example, if third control signal CkoutB is logically high, p-type transistor P4 is deactivated. In this example, if third control signal CkoutB is logically high, inverter I2 is outputs a logically low value.

In this example, n-type transistor N3 is also activated, and if node 3 is pulled to a logical high, n-type transistor N2 is activated and pulls node 2 to a logical low such that second control signal EN is logically low.

At time T3, curve 202 transitions from a logically high value to a logically low value. At time T3, curve 208 is logically high. In some embodiments, if curve 202 (transitions to a logically low value and curve 208 (is logically high, the operation of clock circuit 100 is similar to that above for time T1.

At time T4, curve 202 is logically low. At time T4, curve 204 transitions from a logically low value to a logically high value. At time T4, curve 208 transitions from a logically high value to a logically low value. At time T4, curve 210 transitions from a logically low value to a logically high value.

In some embodiments where the clock circuit is clock circuit 100, if curve 202 is logically low, p-type transistors P3, P6 are activated and n-type transistor N6 is deactivated. In this example, p-type transistor P6 pulls node 3 to a logical high such that third control signal CkoutB is logically high. In this example, if third control signal CkoutB is logically high, inverter I2 outputs a logically low value.

In this example, if curve 208 transitions to a logically low value, p-type transistor P2 is activated. In this example, if curve 202 is logically low, p-type transistor P3 is activated. In this example, p-type transistors P2 and P3 pull node 2 to a logical high such that second control signal EN is logically high. In this example, if curve 210 transitions to a logically high value, p-type transistor P5 and n-type transistor N4 are deactivated, and n-type transistor N5 is activated. In this example, if curve 212 is logically high, p-type transistor P4 is deactivated.

In some embodiments, the clock circuit 100 is configured to output the output clock signal Ckout upon a rising edge of the input clock signal Ckin. In some embodiments, the output clock signal Ckout rises upon a rising edge of the input clock signal Ckin. In some embodiments, the output clock signal Ckout falls upon a falling edge of the input clock signal Ckin.

At time T5, curve 202 transitions from a logically low value to a logically high value. At time T5, curve 212 transitions from a logically high value to a logically low value. At time T5, curve 214 transitions from a logically low value to a logically high value.

In some embodiments where the clock circuit is clock circuit 100, if curve 202 transitions to a logically high value, p-type transistors P3, P6 are deactivated and n-type transistor N6 is activated. In this example, initially after curve 202 transitions to a logically high value, curve 210 remains logically high, and n-type transistor N5 is activated by second control signal EN. In this example, as n-type transistor N5 is activated, node 3 is pulled to a logical low by n-type transistors N5 and N6 by a second discharge path Path2 (FIG. 2). In this example, n-type transistors N5 and N6 provide a second discharge path Path2 to VSS. In this example, n-type transistors N5 and N6 pull node 3 to a logically low signal such that curve 212 is logically low. In this example, if third control signal CkoutB is logically low, inverter I2 outputs a logically high value.

In this example, as node 3 is pulled to a logical low by n-type transistors N5 and N6, p-type transistor P4 is activated by third control signal CkoutB and pulls node 2 to a logical high such that curve 210 is logically high. In this example, if p-type transistor P4 is activated by third control signal CkoutB, curve 210 and node 2 remain logically high. In this example, if curve 210 remains logically high, n-type transistor N4 is deactivated. In this example, if curve 210 is logically high, p-type transistor P5 is deactivated.

In some embodiments, if curve 202 is logically high, p-type transistor P4 and n-type transistor N5 function as a feedback loop such that second control signal EN sets the value of third control signal CkoutB or third control signal CkoutB sets the value of second control signal EN.

At time T6, curve 202 transitions from a logically high value to a logically low value. At time T6, curve 212 transitions from a logically low value to a logically high value. At time T6, curve 214 transitions from a logically high value to a logically low value.

In some embodiments, if curve 202 transitions to a logically low value, p-type transistors P3, P6 are activated and n-type transistor N6 is deactivated. In this example, p-type transistor P6 is pulls node 3 to a logical high such that curve 212 is logically high. In this example, if curve 212 is logically high, curve 214 is logically low.

In some embodiments where the clock circuit is clock circuit 100, if curve 202 transitions to a logically low value and curve 208 is logically low, p-type transistors P2 and P3 are activated and pull node 2 to a logical high such that second control signal EN is a logically high signal. In this example, if curve 210 transitions to a logically high value, p-type transistor P5 and n-type transistor N4 are deactivated, and n-type transistor N5 is activated. In this example, if curve 212 is logically high, p-type transistor P4 is deactivated.

At time T7, curve 202 is logically low. At time T4, curve 204 transitions from a logically high value to a logically low value. At time T7, curve 208 transitions from a logically low value to a logically high value. At time T7, curve 210 transitions from a logically high value to a logically low value.

In some embodiments where the clock circuit is clock circuit 100, if curve 202 transitions to a logically low value and curve 208 transitions to a logically high value, the operation of clock circuit 100 is similar to that described above for time T1.

At time T8, curve 202 is logically high. At time T8, curve 204 transitions from a logically low value to a logically high value. At time T8, curve 208 transitions from a logically high value to a logically low value. At time T8, curve 210 is logically low.

At time T9, curve 202 transitions from a logically high value to a logically low value. At time T9, curve 210 transitions from a logically low value to a logically high value. In some embodiments, if curve 208 changes logic states, i.e., transitions from a logically low value to a logically high value or transitions from a logically high value to a logically low value, curve 210 also changes logic states when curve 202 transitions to a logically low value or is logically low. For example, at time T8 curve 208 transitions from a logically high value to a logically low value, but since curve 202 remains logically high, curve 210 remains a logically high; however, at time T9 curve 202 transitions to a logically low value, and therefore curve 210 transitions from a logically low value to a logically high value.

At time T10, curve 204 transitions from a logically high value to a logically low value. At time T10, curve 208 transitions from a logically low value to a logically high value. At time T10, curve 202 is logically high.

At time T11, curve 202 transitions from a logically high value to a logically low value. At time T11, curve 210 transitions from a logically high value to a logically low value. In some embodiments, curve 208 transitions from a logically low value to a logically high value at time T10, but curve 210 remains logically high until curve 202 transitions from a logically high value to a logically low value at time T11.

At time T12, curve 202 is logically low. At time T12, curve 206 transitions from a logically low value to a logically high value. At time T12, curve 208 transitions from a logically high value to a logically low value. At time T12, curve 210 (transitions from a logically low value to a logically high value.

At time T13, curve 202 is logically low. At time T13, curve transitions from a logically high value to a logically low value. At time T13, curve 208 transitions from a logically low value to a logically high value. At time T13, curve 210 transitions from a logically high value to a logically low value. In some embodiments where the clock circuit is clock circuit 100, if curve 206 transitions to a logically high value, clock circuit 100 is activated or enabled. In this example, if clock circuit 100 is activated or enabled, clock circuit 100 outputs a clock signal, curve 214, that is substantially equal to an input clock signal, curve 202, for a time window between time T12 and T13.

Figure 3:
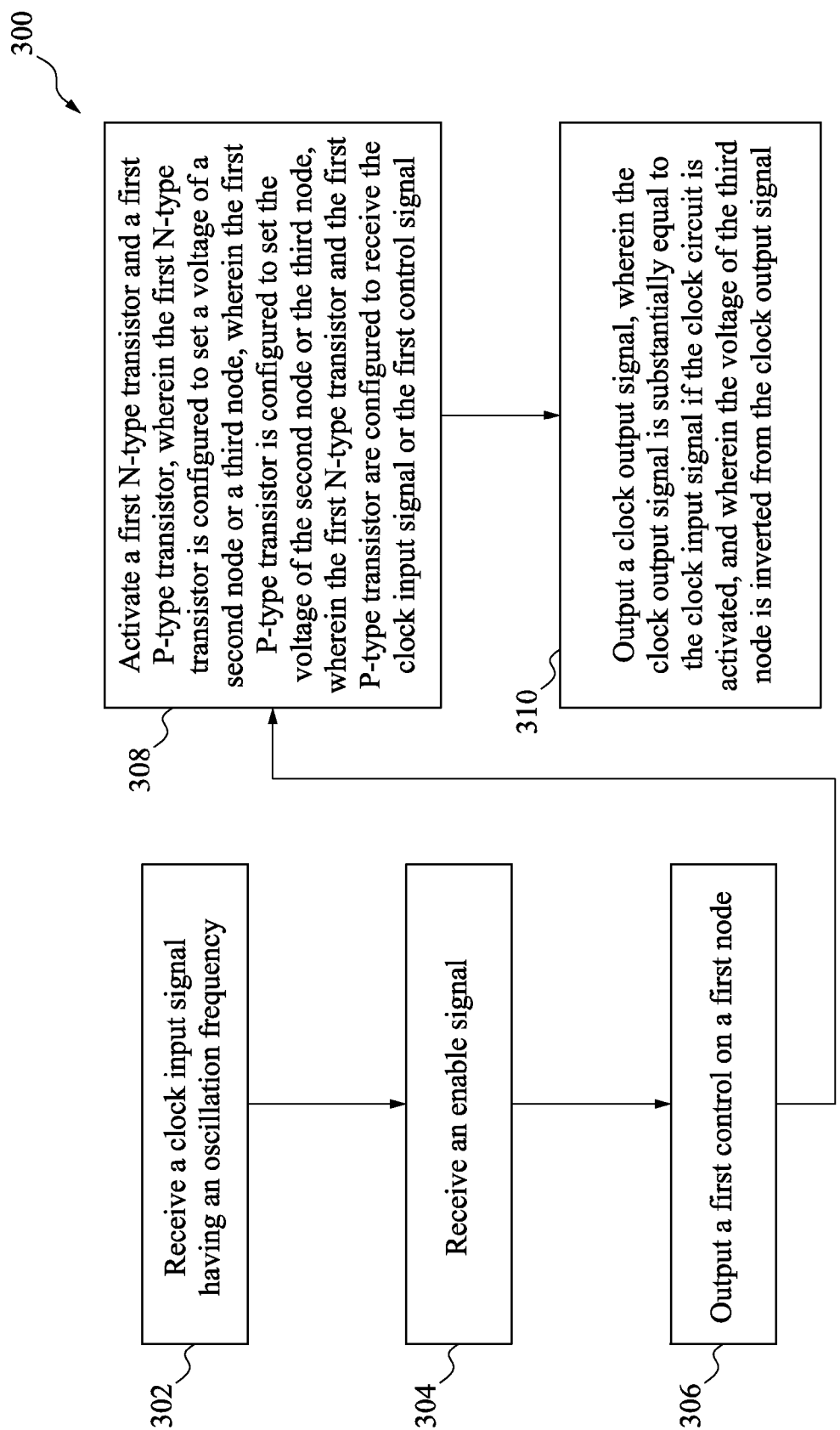
FIG. 3 is a flow chart of a method of operating a clock circuit in accordance with some embodiments.

FIG. 3 is a flow chart of a method 300 of operating a clock circuit in accordance with some embodiments. Method 300 begins with receiving a clock input signal having an oscillation frequency in operation 302. In some embodiments, the clock input signal, e.g. clock input signal Ckin shown in FIG. 1 or 2, has an oscillation frequency Fin indicated by curve 202 in FIG. 2.

Method 300 continues with operation 304 in which a first enable signal, e.g., first enable signal Test_En or a second enable signal Ck_En in FIG. 1 or 2, is received. In some embodiments, the first enable signal, e.g., first enable signal Test_En or second enable signal Ck_En in FIG. 1 or 2, activates the clock circuit, e.g., clock circuit 100 in FIG. 1. In some embodiments, a transition of the enable signal, e.g., first enable signal Test_En or second enable signal Ck_En in FIG. 1 or 2, from a logically low value to a logically high value activates the clock circuit, e.g., clock circuit 100 in FIG. 1. In some embodiments, operation 304 further includes generating a first control signal, e.g., first control signal NEN, based on performing a NOR operation on a first enable signal, e.g., first enable signal Test_En, and a second enable signal, e.g., second enable signal Ck_En.

Method 300 continues with operation 306 in which a first control signal, e.g., first control signal NEN in FIG. 1 or 2, is output at a first node, e.g., node 1 in FIG. 1. In some embodiments, the first control signal, e.g., first control signal NEN in FIG. 1 or 2, is output by a NOR gate, e.g., NOR gate 102 in FIG. 1.

Method 300 continues with operation 308 in which a first N-type transistor, e.g., n-type transistor N3 or N6 in FIG. 1, or a first P-type transistor, e.g., p-type transistor P2, P3 or P6 in FIG. 1, are activated. In some embodiments, the first N-type transistor, e.g., n-type transistor N3 or N6 in FIG. 1, adjusts a voltage of a second node, e.g., node 2 in FIG. 1, or a voltage of a third node, e.g., node 3 in FIG. 1. In some embodiments, the first N-type transistor, e.g., n-type transistor N3 or N6 in FIG. 1, is configured to receive the clock input signal, e.g., clock input signal Ckin in FIG. 1 or 2, or the first control signal, e.g., first control signal NEN in FIG. 1 or 2. In some embodiments, the first P-type transistor, e.g., p-type transistor P2, P3 or P6 in FIG. 1, is adjusts a voltage of the second node, e.g., node 2 in FIG. 1, or a voltage of the third node, e.g., node 3 in FIG. 1. In some embodiments, the first P-type transistor, e.g., p-type transistor P2, P3 or P6 in FIG. 1, is configured to receive the clock input signal, e.g., clock input signal Ckin in FIG. 1 or 2, or the first control signal, e.g., first control signal NEN in FIG. 1 or 2.

In some embodiments, operation 308 further includes activating a second N-type transistor, e.g., n-type transistor N4. For example, in these embodiments, the first N-type transistor, e.g., n-type transistor N6, and the second N-type transistor, e.g., n-type transistor N4, pull the voltage of the second node, e.g., node 2, to a logical low, and provide a first discharge path, e.g., first discharge path Path1.

In some embodiments, operation 308 further includes activating a second N-type transistor, e.g., n-type transistor N5. For example, in these embodiments, the first N-type transistor, e.g., n-type transistor N6, and the second N-type transistor, e.g., n-type transistor N5, pull the voltage of the third node, e.g., node 3, to a logical low, and provide a second discharge path, e.g., second discharge path Path2. For example, in these embodiments, the clock output signal, e.g., clock output signal Ckout, is substantially equal to the clock input signal, e.g., clock input signal Ckin.

In some embodiments, operation 308 further includes activating a second P-type transistor, e.g., p-type transistor P5 or P6, and deactivating a third P-type transistor, e.g., p-type transistor P2, P3, P4 or P5. For example, in these embodiments, the second P-type transistor, e.g., p-type transistor P5 or P6, is pulls the voltage of the third node, e.g., node 3, to a logical high and the clock output signal, e.g., clock output signal Ckout, is a logical low.

In some embodiments, operation 308 further includes activating a second P-type transistor, e.g., p-type transistor P2, P3 or P4, and deactivating a third P-type transistor, e.g., p-type transistor P4, P5 or P6. For example, in these embodiments, the first P-type transistor, e.g., p-type transistor P2 or P3, and the second P-type transistor, e.g., p-type transistor P2, P3 or P4, pull the voltage of the second node, e.g., node 2, to a logical high and the clock output signal, e.g., clock output signal Ckout, is a logical low.

Method 300 continues with operation 310 in which a clock output signal, e.g., clock output signal Ckout in FIG. 1 or 2, is output. In some embodiments, if the clock circuit, e.g., clock circuit 100 in FIG. 1, is activated the clock output signal, e.g., clock output signal Ckout in FIG. 1 or 2, is substantially equal to the clock input signal, e.g., clock input signal Ckin in FIG. 1 or 2. In some embodiments, a voltage of the third node, e.g., node 3 in FIG. 1, is inverted from the clock output signal, e.g., clock output signal Ckout in FIG. 1 or 2.

In some embodiments, operations are able to be removed or additional operations are able to be added to method 300 without departing from the scope of this description. In some embodiments, an order of operations in method 300 is adjusted without departing from the scope of this description.

One aspect of this description relates to a clock circuit. The clock circuit includes a first transistor, a first inverter and a second transistor. A first terminal of the first transistor is configured to receive a clock input signal. A second terminal of the first transistor is coupled to a first node. The first transistor being configured to adjust a voltage of the first node to a first voltage level based on the clock input signal. The first inverter is coupled to the first node. The first inverter is configured to receive the voltage of the first node. The first inverter being configured to output a clock output signal. A first terminal of the second transistor is configured to receive the clock input signal. A second terminal of the second transistor is coupled to the first node and a second node. The second transistor is configured to adjust the voltage of the first node or a voltage of the second node to a second voltage level based on the clock input signal.

Another aspect of this description relates to a semiconductor device including a clock circuit. The clock circuit includes a first transistor, a first inverter, a second transistor and a third transistor. A first terminal of the first transistor is configured to receive a clock input signal. A second terminal of the first transistor is coupled to a first node. The first transistor is configured to adjust a voltage of the first node to a first voltage level based on the clock input signal. The first inverter is coupled to the first node. The first inverter is configured to receive the voltage of the first node. The first inverter is configured to output a clock output signal. A first terminal of the second transistor is configured to receive the clock input signal. A second terminal of the second transistor is coupled to the first node and a second node. The second transistor is configured to adjust the voltage of the first node or a voltage of the second node to a second voltage level based on the clock input signal. A first terminal of the third transistor is coupled to a third node. The first terminal of the third transistor is configured to receive a first control signal. A second terminal of the third transistor is coupled to the second node. The third transistor is configured to adjust the voltage of the second node to the first voltage level or to the second voltage level based on the first control signal.

Still another aspect of this description relates to a method of operating a clock circuit. The method includes activating a clock circuit in response to an enable signal. The method further includes activating a first transistor or a second transistor in response to a clock input signal, the clock input signal having an oscillation frequency. The method further includes adjusting, using the activated first transistor, a voltage of a first node to a first voltage level. The method further includes adjusting, using the activated second transistor, the voltage of the first node to a second voltage level or adjusting a voltage of a second node to the second voltage level, wherein the second transistor is coupled to the first node and the second node. The method further includes outputting a clock output signal, wherein a logic state of the clock output signal is inverted with respect to a logic state of the first node, and an amplitude of the lock output signal is substantially equal to an amplitude of the clock input signal.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A clock circuit comprising:
    a first transistor having a first terminal and a second terminal, the first terminal of the first transistor configured to receive a clock input signal, the second terminal of the first transistor coupled to a first node, and the first transistor configured to adjust a voltage of the first node to a first voltage level based on the clock input signal;
    a first inverter coupled to the first node, the first inverter configured to receive the voltage of the first node, and the first inverter being configured to output a clock output signal; and
    a second transistor having a first terminal and a second terminal, the first terminal of the second transistor configured to receive the clock input signal, the second terminal of the second transistor coupled to the first node and a second node, and the second transistor configured to adjust the voltage of the first node or a voltage of the second node to a second voltage level based on the clock input signal.

2. The clock circuit of claim 1, wherein the first transistor is a P-type transistor, the second transistor is an N-type transistor, the first voltage level is a power supply voltage, and the second voltage level is a ground voltage.

3. The clock circuit of claim 1, further comprising a third transistor having a first terminal, a second terminal and a third terminal,
    the first terminal of the third transistor configured to receive the voltage of the second node,
    the second terminal of the third transistor coupled to the first node, the second terminal of the first transistor and the first inverter,
    the third terminal of the third transistor coupled to the second terminal of the second transistor, and
    the third transistor configured to adjust the voltage of the first node to the second voltage level based on the voltage of the second node.

4. The clock circuit of claim 1, further comprising a third transistor having a first terminal, a second terminal and a third terminal,
    the first terminal of the third transistor configured to receive an inverted voltage of the second node,
    the second terminal of the third transistor coupled to the second node,
    the third terminal of the third transistor coupled to the second terminal of the second transistor, and
    the third transistor configured to adjust the voltage of the second node to the second voltage level based on the inverted voltage of the second node.

5. The clock circuit of claim 4, further comprising a second inverter having a first terminal and a second terminal,
    the first terminal of the second inverter coupled to the second node,
    the first terminal of the second inverter configured to receive the voltage of the second node,
    the second terminal of the second inverter coupled to the first terminal of the third transistor, and
    the second terminal of the second inverter configured to output the inverted voltage of the second node.

6. The clock circuit of claim 1, further comprising a third transistor having a first terminal, a second terminal and a third terminal,
    the first terminal of the third transistor configured to receive a clock input signal,
    the second terminal of the third transistor coupled to the second node,
    the third terminal of the third transistor coupled to a terminal of the first voltage level, and
    the third transistor configured to adjust the voltage of the second node to the first voltage level based on the clock input signal.

7. The clock circuit of claim 1, further comprising a third transistor having a first terminal, a second terminal and a third terminal,
    the first terminal of the third transistor coupled to the first node, the first inverter and the second terminal of the first transistor,
    the first terminal of the third transistor configured to receive the voltage of the first node,
    the second terminal of the third transistor coupled to a terminal of the first voltage level, the third terminal of the third transistor coupled to the second node, and the third transistor configured to adjust the voltage of the second node to the first voltage level based on the voltage of the first node.

8. The clock circuit of claim 1, further comprising a third transistor having a first terminal, a second terminal and a third terminal, the first terminal of the third transistor coupled to the first node, the first inverter and the second terminal of the first transistor, the first terminal of the third transistor configured to receive the voltage of the first node, the second terminal of the third transistor coupled to a terminal of the second voltage level, the third terminal of the third transistor coupled to the second node, and the third transistor configured to adjust the voltage of the second node to the second voltage level based on the voltage of the first node.

9. The clock circuit of claim 1, further comprising a third transistor having a first terminal, a second terminal and a third terminal, the first terminal of the third transistor configured to receive the voltage of the second node, the second terminal of the third transistor coupled to a terminal of the first voltage level, the third terminal of the third transistor coupled to the first node, the first inverter and the second terminal of the first transistor, and the third transistor configured to adjust the voltage of the first node to the first voltage level based on the voltage of the second node.

10. A semiconductor device comprising:
a clock circuit comprising:
a first transistor having a first terminal and a second terminal, the first terminal of the first transistor configured to receive a clock input signal, the second terminal of the first transistor coupled to a first node, and the first transistor configured to adjust a voltage of the first node to a first voltage level based on the clock input signal;
a first inverter being coupled to the first node, the first inverter configured to receive the voltage of the first node, and the first inverter configured to output a clock output signal;
a second transistor having a first terminal and a second terminal, the first terminal of the second transistor configured to receive the clock input signal, the second terminal of the second transistor coupled to the first node and a second node, and the second transistor configured to adjust the voltage of the first node or a voltage of the second node to a second voltage level based on the clock input signal;
a third transistor having a first terminal and a second terminal, the first terminal of the third transistor coupled to a third node, the first terminal of the third transistor configured to receive a first control signal, the second terminal of the third transistor coupled to the second node, and the third transistor configured to adjust the voltage of the second node to the first voltage level or to the second voltage level based on the first control signal.

11. The semiconductor device of claim 10, wherein the clock circuit further comprises a NOR gate coupled to the third node, the NOR gate configured to receive an enable signal, and the NOR gate configured to output the first control signal on the third node.

12. The semiconductor device of claim 10, further comprising a fourth transistor having a first terminal, a second terminal and a third terminal, the first terminal of the fourth transistor coupled to the second terminal of the third transistor, the first terminal of the fourth transistor configured to receive the voltage of the second node, the second terminal of the fourth transistor coupled to the first node, the second terminal of the first transistor and the first inverter, the third terminal of the fourth transistor coupled to the second terminal of the second transistor, and the fourth transistor configured to adjust the voltage of the first node to the second voltage level based on the voltage of the second node.

13. The semiconductor device of claim 10, further comprising a fourth transistor having a first terminal, a second terminal and a third terminal, the first terminal of the fourth transistor configured to receive an inverted voltage of the second node, the second terminal of the fourth transistor coupled to the second node and the second terminal of the third transistor, the third terminal of the fourth transistor coupled to the second terminal of the second transistor, and the fourth transistor configured to adjust the voltage of the second node to the second voltage level based on the inverted voltage of the second node.

14. The semiconductor device of claim 13, further comprising a second inverter having a first terminal and a second terminal, the first terminal of the second inverter coupled to the second node and the second terminal of the third transistor, the first terminal of the second inverter configured to receive the voltage of the second node, the second terminal of the second inverter coupled to the first terminal of the fourth transistor, and the second terminal of the second inverter configured to output the inverted voltage of the second node.

15. The semiconductor device of claim 10, further comprising a fourth transistor having a first terminal, a second terminal and a third terminal, the first terminal of the fourth transistor configured to receive a clock input signal, the second terminal of the fourth transistor coupled to the second node and the second terminal of the third transistor, the third terminal of the fourth transistor coupled to a terminal of the first voltage level, and the fourth transistor configured to adjust the voltage of the second node to the first voltage level based on the clock input signal.

16. A method of operating a clock circuit, the method comprising:
activating a clock circuit in response to an enable signal;
activating a first transistor or a second transistor in response to a clock input signal, the clock input signal having an oscillation frequency;
adjusting, using the activated first transistor, a voltage of a first node to a first voltage level;
adjusting, using the activated second transistor, the voltage of the first node to a second voltage level or adjusting a voltage of a second node to the second voltage level, wherein the second transistor is coupled to the first node and the second node; and outputting a clock output signal, wherein a logic state of the clock output signal is inverted with respect to a logic state of the first node, and an amplitude of the clock output signal is substantially equal to an amplitude of the clock input signal.

17. The method of claim 16, further comprising:

activating a third transistor in response to the voltage of the second node; and adjusting, using the activated third transistor, the voltage of the first node to the second voltage level based on the voltage of the second node, wherein the third transistor is coupled to the first node, the first transistor and the second transistor.

18. The method of claim 16, further comprising:

activating a third transistor in response to an inverted voltage of the second node; and adjusting, using the activated third transistor, the voltage of the second node to the second voltage level based on the inverted voltage of the second node, wherein the third transistor is coupled to the second node, the second transistor and an inverter.

19. The method of claim 16, further comprising:

generating a first control signal based on performing a NOR operation on a first enable signal with a second enable signal, wherein the first control signal comprises the first enable signal and the second enable signal;

activating a third transistor in response to the first control signal; and adjusting, using the activated third transistor, the voltage of the second node to the first voltage level or the second voltage level based on the first control signal, wherein the third transistor is coupled to the second node and a NOR gate.

20. The method of claim 19, further comprising:

activating a fourth transistor in response to the clock input signal; and adjusting, using the activated fourth transistor, the voltage of the second node to the first voltage level based on the clock input signal, wherein the fourth transistor is coupled to the third transistor and the second node.

* * * * *